(12) United States Patent
Ahn

(10) Patent No.: US 6,949,783 B2
(45) Date of Patent: Sep. 27, 2005

(54) MEMORY CELL TRANSISTOR HAVING DIFFERENT SOURCE/DRAIN JUNCTION PROFILES CONNECTED TO DC NODE AND BC NODE AND MANUFACTURING METHOD THEREOF

(75) Inventor: Su-jin Ahn, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 10/235,142

(22) Filed: Sep. 5, 2002

(65) Prior Publication Data

US 2003/0205740 A1 Nov. 6, 2003

(30) Foreign Application Priority Data

May 2, 2002 (KR) ........................................ 2002-24198

(51) Int. Cl.[7] ........................ H01L 27/108; H01L 29/76
(52) U.S. Cl. ........................................ 257/300; 257/306
(58) Field of Search ................................. 257/300, 306

(56) References Cited

U.S. PATENT DOCUMENTS

| 5,198,386 | A | * | 3/1993 | Gonzalez | 438/253 |
| 5,208,470 | A | * | 5/1993 | Lee et al. | 257/296 |
| 5,250,832 | A | * | 10/1993 | Murai | 257/306 |
| 5,276,344 | A | * | 1/1994 | Arima et al. | 257/336 |
| 5,650,349 | A | * | 7/1997 | Prall et al. | 438/307 |
| 5,926,707 | A | * | 7/1999 | Seo | 438/238 |
| 5,932,906 | A | * | 8/1999 | Shimizu | 257/306 |
| 6,121,650 | A | * | 9/2000 | Akamatsu | 257/296 |
| 6,300,655 | B1 | * | 10/2001 | Ema et al. | 257/306 |
| 6,380,045 | B1 | * | 4/2002 | Guo | 438/396 |

FOREIGN PATENT DOCUMENTS

| JP | 02-281654 | * 11/1990 | 257/306 |

* cited by examiner

Primary Examiner—George Eckert
(74) Attorney, Agent, or Firm—F. Chau & Associates LLC

(57) ABSTRACT

A memory cell transistor of a DRAM device is provided. A gate stack pattern is formed on a semiconductor substrate. A DC node and a BC node are formed substantially under lateral sides of the gate stack pattern in the semiconductor substrate. The DC node and the BC node are being electrically connected to a bit line and a storage electrode of a capacitor respectively. A first source/drain junction region is formed under the DC node and a second source/drain junction region is formed under the BC node. The first source/drain junction region has a profile which is different from that of the second source/drain junction region.

16 Claims, 6 Drawing Sheets

MEMORY CELL TRANSISTOR HAVING DIFFERENT SOURCE/DRAIN JUNCTION PROFILES CONNECTED TO DC NODE AND BC NODE AND MANUFACTURING METHOD THEREOF

BACKGROUND OF THE INVENTION

1. Field of the Invention

The present invention relates to a semiconductor memory device and, more particularly, to memory cell transistor of a dynamic random access memory (DRAM) device having different source/drain junction profile connected to a direct contact (DC) node and a buried contact (BC) node.

2. Description of the Related Art

DRAM devices are generally used as a main memory of a computer system. A DRAM memory cell comprises a transistor and a capacitor. Data is stored in a memory cell by charge retention in the capacitor. If the memory cell is not periodically refreshed, the stored data will be lost due to capacitor discharge, since the capacitor is not perfectly isolated, and leakage current flows from the capacitor to surrounding coupled devices.

As DRAM devices become highly integrated, the channel length of the memory cell transistor is shortened and dosage amount in source/drain junction regions is increased; as a result, static refresh characteristics are deteriorated. To improve the static refresh characteristics, a method for controlling a depth of the source/drain junction regions has been proposed.

FIG. 1 is a cross-sectional diagram of a conventional memory cell transistor of the DRAM device having source/drain junction regions connected to a BC node and a DC node.

Referring to FIG. 1, a gate stack pattern 20 is formed as a cell transistor on a semiconductor substrate 10. The gate stack pattern 20 comprises a gate electrode having a gate insulating layer 12, a polysilicon layer 14, a silicide layer 16, and a capping insulating layer 18. Generally, the gate electrode is used as a word line. Both lateral sides of the gate stack pattern 20 have spacers 26 having an oxide layer 22 and a nitride layer 24. Source/drain junction regions 32 are formed substantially under the spacers 26. Each of the source/drain junction regions 32 includes a source/drain ion injection region 28 and a plug ion injection region 30. One of the source/drain junction regions 32 is used as a direct contact (DC) node electrically connected to a bit line and the other one is used as a buried contact (BC) node electrically connected to a storage electrode of a capacitor.

The plug ion injection region 30 is made deeper than the source/drain ion injection region 28 to reduce junction leakage for improving static refresh characteristics. The plug ion injection region 30 is generally formed from phosphorous (P) which has a lower threshold voltage. A low threshold voltage means inferior dynamic refresh characteristics.

Therefore, it is desirable to provide a memory cell transistor of a DRAM device having improved dynamic refresh characteristics as well as static refresh characteristics.

SUMMARY OF THE INVENTION

A memory cell transistor of a DRAM device is provided, which includes: a gate stack pattern formed on a semiconductor substrate; a DC node and a BC node formed substantially under lateral sides of the gate stack pattern in the semiconductor substrate, the DC node and the BC node being electrically connected to a bit line and a storage electrode of a capacitor, respectively; and a first source/drain junction region formed under the DC node and a second source/drain junction region formed under the BC node, wherein the first source/drain junction region has a profile which is different from that of the second source/drain junction region.

According to an embodiment of the present invention, a depth of the second source/drain junction region electrically connected to the BC node is deeper than a depth of the first source/drain junction region electrically connected to the DC node. The source/drain junction regions include implanted phosphorous as impurity.

Preferably, the memory cell transistor further includes spacers at the both lateral sides of the gate stack pattern.

A memory cell transistor of a DRAM device is also provided, which includes: a gate stack pattern formed on a semiconductor substrate; a DC node and a BC node formed substantially under lateral sides of the gate stack pattern and in a substantially surface of the semiconductor substrate, the DC node and the BC node being electrically connected to a bit line and a storage electrode of a capacitor, respectively; and source/drain junction regions comprising source/drain ion injection regions and plug ion injection regions formed under the DC node and the BC node, the plug ion injection regions being formed deeper than the source/drain ion injection regions, wherein profiles of the source/drain junction regions are different.

According to an embodiment of the present invention, a depth of the source/drain junction region electrically connected to the BC node is deeper than a depth of the source/drain junction region electrically connected to the DC node. The source/drain junction regions include implanted phosphorous as impurity.

Preferably, the memory cell transistor further includes spacers at the both lateral sides of the gate stack pattern.

A method of forming a memory cell transistor of a DRAM device is also provided, the method includes the steps of: forming a gate stack pattern on a semiconductor substrate; forming source/drain ion injection regions to be electrically connected to a DC node and a BC node substantially under lateral sides of the gate stack pattern and in a substantially surface of the semiconductor substrate; forming plug ion injection regions in the source/drain injection regions; and forming a compensation ion injection region in the plug ion injection region to be connected to the DC node, wherein the source/drain junction regions comprises the source/drain ion injection regions and plug ion injection regions, and profiles of the source/drain junction regions are different.

According to an embodiment of the present invention, a depth of the source/drain junction region electrically connected to the BC node is deeper than a depth of the source/drain junction region electrically connected to the DC node. The source/drain ion injection regions are implanted with phosphorous by using about $1E^{+13}/cm^2$ of dose amount and about 20 kev to about 30 kev of energy. The plug ion injection regions are implanted with phosphorous by using about $1E^{+13}/cm^2$ of dose amount and about 40 kev to about 60 kev of energy. The compensation ion injection region is implanted with boron by using about $6E^{+12}/cm^2$ to about $1E^{+13}/cm^2$ of dose amount and about 20 kev to about 40 kev of energy.

A method of forming a memory cell transistor of a DRAM device is also provided, the method includes the steps of: forming gate stack patterns on a semiconductor substrate; forming source/drain ion injection regions substantially under lateral sides of the gate stack patterns and in a substantially surface of the semiconductor substrate; forming self-align contact patterns having a DC hole and a BC hole for exposing source/drain ion injection regions on the semiconductor substrate; forming plug ion injection regions by implanting impurity into the DC hole and the BC hole by using the self-align contact patterns as masks; and forming a compensation ion injection region by selectively implanting impurity into the DC hole by using the self-aligned contact patterns and the gate stack patterns as masks, wherein the source/drain junction region comprises the source/drain ion injection regions and plug ion injection regions, and profiles of the source/drain junction regions are different.

According to an embodiment of the present invention, a depth of the source/drain junction region electrically connected to the BC node is deeper than a depth of the source/drain junction region electrically connected to the DC node. The impurity for forming the compensation ion injection region is implanted with an inclined angle by using the self-aligned contact patterns and the gate stack patterns as masks. Profiles of the source/drain junction regions are variable by varying a space between the self-aligned contact patterns. The source/drain ion injection regions are implanted with phosphorous by using about $1E^{+13}/cm^2$ of dose amount and about 20 kev to about 30 kev of energy. The plug ion injection regions are implanted with phosphorous by using about $1E^{+13}/cm^2$ of dose amount and about 40 kev to about 60 kev of energy. The compensation ion injection region is implanted with boron by using about $6E^{+12}/cm^2$ to about $1E^{+13}/cm^2$ of dose amount and about 20 kev to about 40 kev of energy.

BRIEF DESCRIPTION OF THE DRAWINGS

The above and other objects and advantages of the present invention will become more apparent by describing in detail preferred embodiments thereof with reference to the accompanying drawings in which.

DETAILED DESCRIPTION OF PREFERRED EMBODIMENTS

Figure 1:
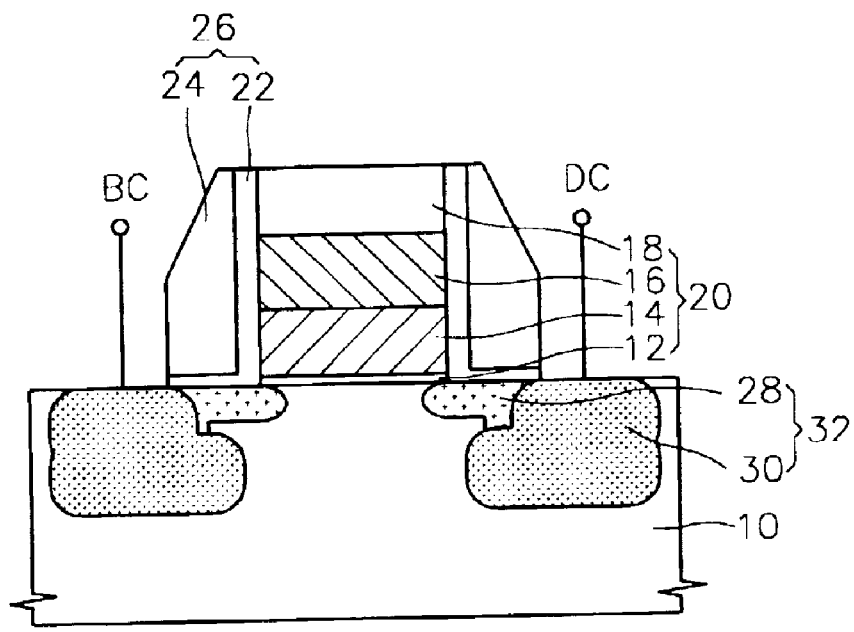
FIG. 1 is a cross-sectional diagram of a conventional memory cell transistor of the DRAM device having source/drain junction regions connected to a BC node and a DC node.

Hereinafter, the present invention will be described in detail with reference to the accompany drawings. It should be noted that like reference numerals are used for designation of like or equivalent parts or portion for simplicity of illustration and explanation. Also, in the following description, specifications will be made to provide a thorough understanding about the present invention. It is apparent to one skilled in the art that the present invention can be achieved without the specifications. There will be omission of detailed description about well known functions and structures to clarify key points of the present invention.

Figure 2:
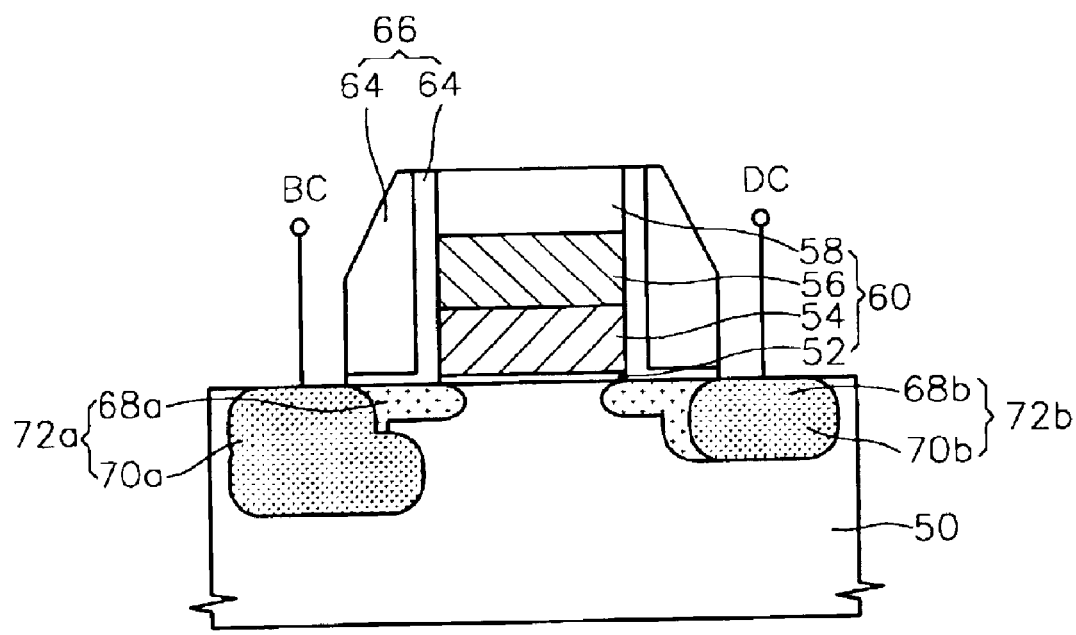
FIG. 2 is a cross-sectional diagram of a memory cell transistor of a DRAM device having different source/drain junction region profiles connected to a BC node and a DC node according to a DRAM device of the present invention.

FIG. 2 is a cross-sectional diagram of a memory cell transistor of a DRAM device having different source/drain junction region profiles connected to a BC node and a DC node according to a DRAM device of the present invention.

Referring to FIG. 2, the memory cell transistor of the DRAM device comprises a gate stack pattern 60 formed on a substrate 50. The gate stack pattern 60 includes a gate electrode having a insulating layer 52, a polysilicon layer 54, a silicide layer 56, and a capping insulating layer 58 sequentially formed on the gate electrode. The gate electrode is preferably used as a word line. The capping insulating layer 58 is preferably formed of a nitride layer. Both lateral sides of the gate stack pattern 60 have spacers 66, and each spacer 66 includes an oxide layer 62 and a nitride layer 64. Source/drain junction regions 72A, 72B are formed in the substrate 50 surrounding the gate stack pattern 60 except substantially under the gate stack pattern 60. According to an embodiment of the present invention, the source/drain junction regions 72A, 72B includes phosphorus as an impurity. The source/drain junction region 72A includes a source/drain ion injection region 68A and a plug ion injection region 70A. Similarly, the source/drain junction region 72B includes a source/drain ion injection region 68B and a plug ion injection region 70B. The source/drain junction region 72A is electrically connected to a BC (buried contact) node which is electrically connected to a storage electrode (not shown) of a capacitor (not shown) and the source/drain junction region 72B is electrically connected to a DC (direct contact) node (not shown) electrically connected to a bit line (not shown).

According to an embodiment of the present invention, the plug ion injection regions 70A, 70B are made deeper than the source/drain ion injection regions 68A, 68B to reduce junction leakage for improving static refresh characteristics. Further, the source/drain junction regions 72A, 72B have different profiles. The plug ion injection region 70A electrically connected to the BC node is formed more deeply than the plug ion injection region 70B electrically connected to the DC node. Thus, the source/drain junction region 72B connected to the DC node is more shallow than the source/drain junction region 72A connected to the BC node. Further, the plug ion injection region 70A electrically is deeper than the source/drain ion injection region 68A.

Figure 3:
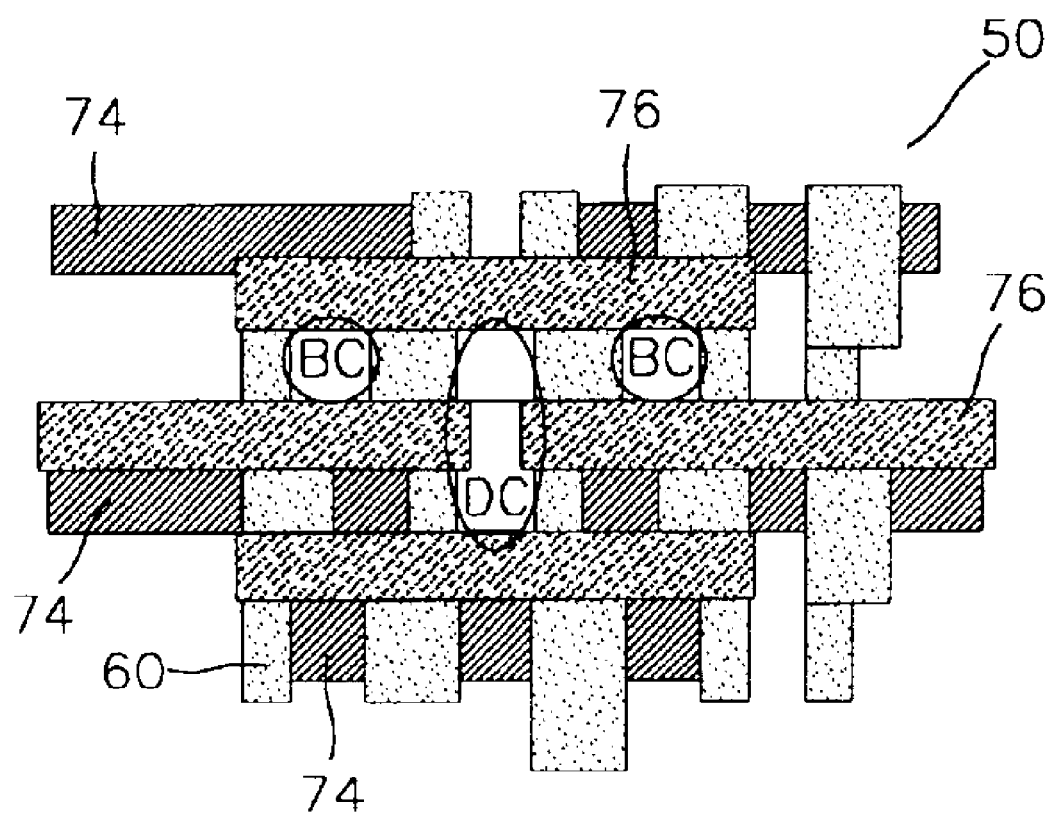
FIG. 3 shows a layout having a BC hole, a DC hole, and a self-aligned contact pattern of a memory cell transistor of a DRAM device according to the present invention.

FIG. 3 is a layout diagram having a BC hole, a DC hole, and a self-aligned contact pattern of the memory cell transistor. Same reference numerals in FIG. 3 denote the same members in FIG. 2.

Referring to FIG. 3, active patterns 74 are formed on the substrates 50 in a width-wise direction. The other region of the substrate 50 except the active patterns 74 denotes a non-active region. Gate stack patterns 60 are formed on the substrate 50 in a column-wise direction across the active patterns 74. Self-aligned contact patterns 76 are formed parallel to the active patterns 74 across the gate stack patterns 60.

DC holes (denoted DC in FIG. 3) and BC holes (denoted BC in FIG. 3) are formed on the active patterns 74 between the gate stack patterns 60. The DC holes and the BC holes are exposed by using the self-aligned contact patterns 76 as masks. The DC holes expose the non-active region as well as the active patterns 74. The DC holes and the BC holes are used for forming DC nodes electrically connected to bit lines and BC nodes electrically connected to storage electrodes of capacitors, respectively.

Figure 4:
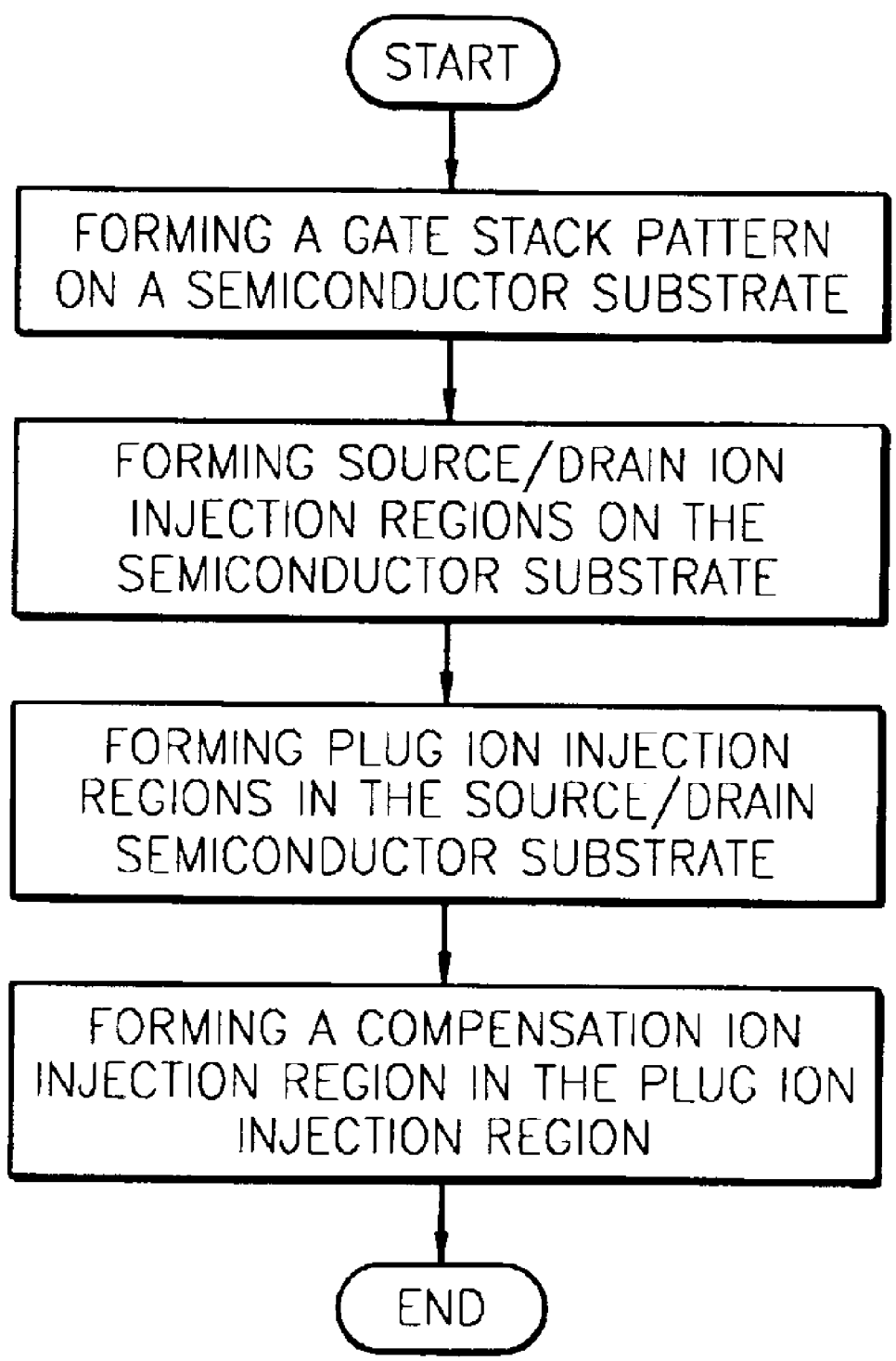
FIG. 4 is a flow chart for describing a manufacturing method of a memory cell transistor of a DRAM device according to an embodiment of the present invention.

FIG. 4 is a flow chart for describing a manufacturing method of a memory cell transistor of a DRAM device according to an embodiment of the present invention.

Referring to FIG. 4, a gate stack pattern (reference numeral 60 of FIGS. 2 and 3) is formed on a semiconductor substrate such as a silicon substrate (Step 101). The gate electrode is a stacked pattern sequentially formed with a gate insulating layer, a polysilicon layer, a silicide layer, and a capping insulating layer. The gate electrode is used as a word line of the memory cell transistor. The capping insulating layer is preferably formed of a nitride layer.

Next, source/drain ion injection regions (reference numeral 68A and 68B of FIG. 2) are formed on the semiconductor substrate substantially under lateral sides of the gate stack pattern (Step 103). The source/drain ion injection regions are implanted with phosphorous by using about $1E+^{13}/cm^2$ of dose amount and about 20 kev to about 30 kev of energy. The source/drain ion injection regions are electrically connected to a DC node connected to a bit line and a BC node electrically connected to a storage electrode of a capacitor. When the source/drain ion injection regions are formed with a LDD (light doped drain) structure, spacers are preferably formed on lateral sides of the gate stack pattern.

Next, plug ion injection regions are formed in the source/drain ion injection regions more deeply than the source/drain ion injection regions (Step 105). The plug ion injection regions are implanted with phosphorous by using about $1E+^3/cm^2$ of dose amount and about 40 kev to about 60 kev of energy.

Next, a compensation ion injection region is formed in the plug ion injection region to be electrically connected to the DC node by implanting impurity (Step 107). The compensation ion injection region is formed by implanting boron with about $6E+^{12}/cm^2$ to about $1E+^{13}/cm^2$ of dose amount and about 20 kev to about 40 kev of energy. By forming the compensation ion injection region having boron, a depth of the plug ion injection region to be electrically connected to the DC node is shallower than a depth of the plug ion injection region to be electrically connected to the BC node. As a result, the source/drain junction regions have different profiles. Advantageously, the plug ion injection region electrically connected to the BC node is formed deeper, thereby improving static refresh characteristics, and the plug ion injection region electrically connected to the DC node is formed shallower, thereby improving dynamic refresh characteristics.

Figure 5:
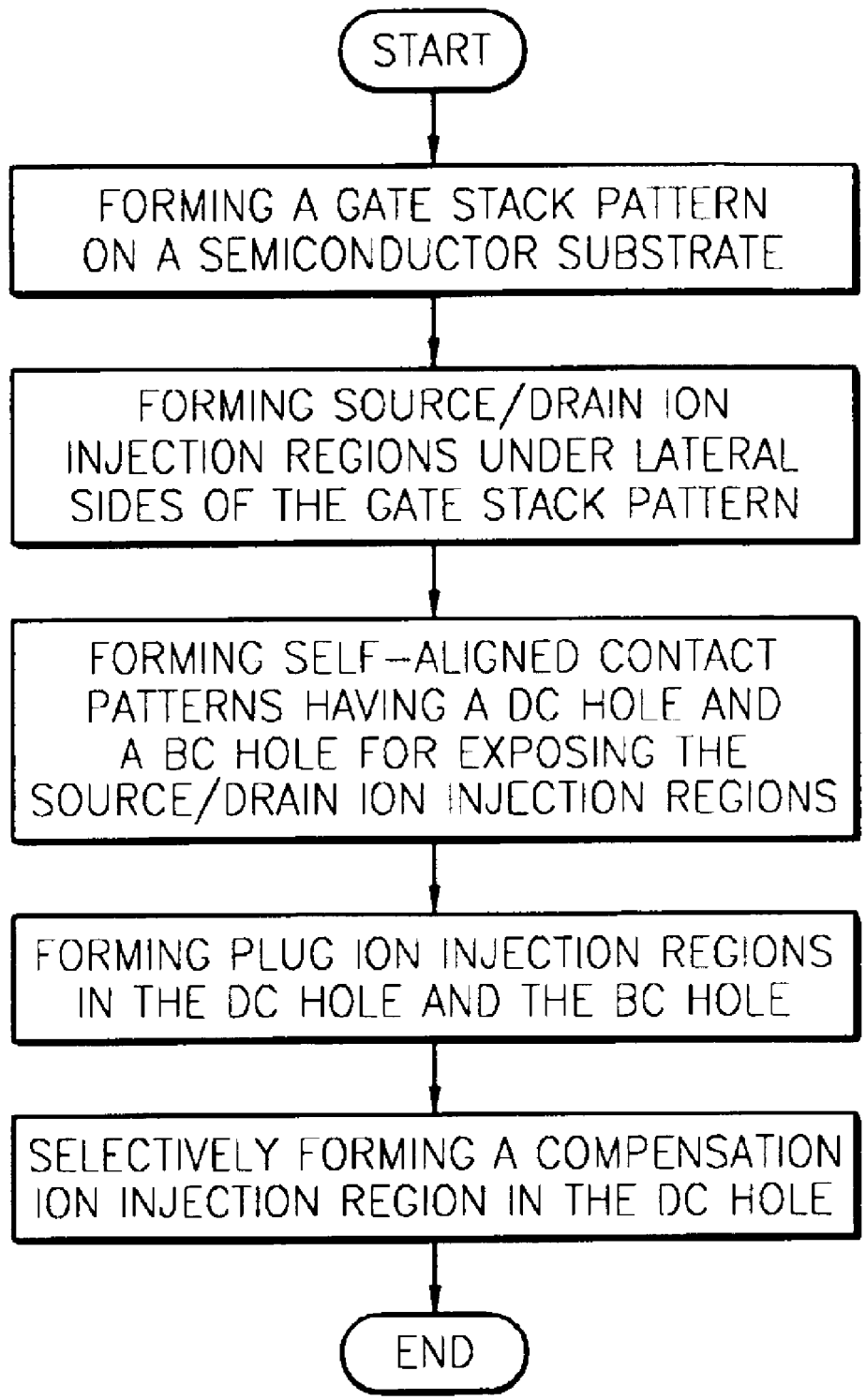
FIG. 5 is a flow chart for describing a manufacturing method of a memory cell transistor of a DRAM device according to another embodiment of the present invention.

FIG. 5 is a flow chart for describing a manufacturing method of a memory cell transistor of a DRAM device according to another embodiment of the present invention.

Referring to FIG. 5, a gate stack pattern (reference numeral 60 of FIGS. 2 and 3) is formed on a semiconductor substrate such as a silicon substrate (Step 201). A gate electrode and a capping insulating layer are formed from the gate stack pattern. The gate electrode is sequentially formed with a gate insulating layer, a polysilicon layer, and a silicide layer. The gate electrode is used as a word line of the memory cell transistor. The capping insulating layer is preferably formed of a nitride layer.

Next, source/drain ion injection regions (reference numeral 68A and 68B of FIG. 2) are formed on the semiconductor substrate substantially under lateral sides of the gate stack pattern (Step 203). The source/drain ion injection regions are implanted with phosphorous by using about $1E+^{13}/cm^2$ of dose amount and about 20 kev to about 30 kev of energy.

Next, self-aligned contact patterns (reference numeral 76 of FIG. 3) having a DC hole and a BC hole are formed for exposing the source/drain ion injection regions (Step 205). That is, the self-aligned contact patterns are formed for exposing active regions formed between the gate stack patterns. The DC hole is to be electrically connected to a DC node and the BC hole is to be electrically connected to a BC hole.

Next, plug ion injection regions are formed in the DC hole and the BC hole by implanting impurity by using the self-aligned contact patterns as masks (Step 207). The plug ion injection regions are implanted with phosphorous by using about $1E+^{13}/cm^2$ of dose amount and about 40 kev to about 60 kev of energy.

Next, a compensation ion injection region is formed in the DC hole by selectively implanting impurity by using the self-aligned contact patterns as masks (Step 209). The compensation ion injection region is formed by implanting boron with about $6E+^{12}/cm^2$ to about $1E+^{13}/cm^2$ of dose amount and about 20 kev to about 40 kev of energy. By forming the compensation ion injection region having boron, a depth of the plug ion injection region electrically connected to the DC node is shallower than a depth of the plug ion injection region electrically connected to the BC node. As a result, the source/drain junction regions have different profiles. Advantageously, the plug ion injection region electrically connected to the BC node is formed deeper, thereby improving static refresh characteristics, and the plug ion injection region electrically connected to the DC node is formed shallower, thereby improving dynamic refresh characteristics.

Figure 6:
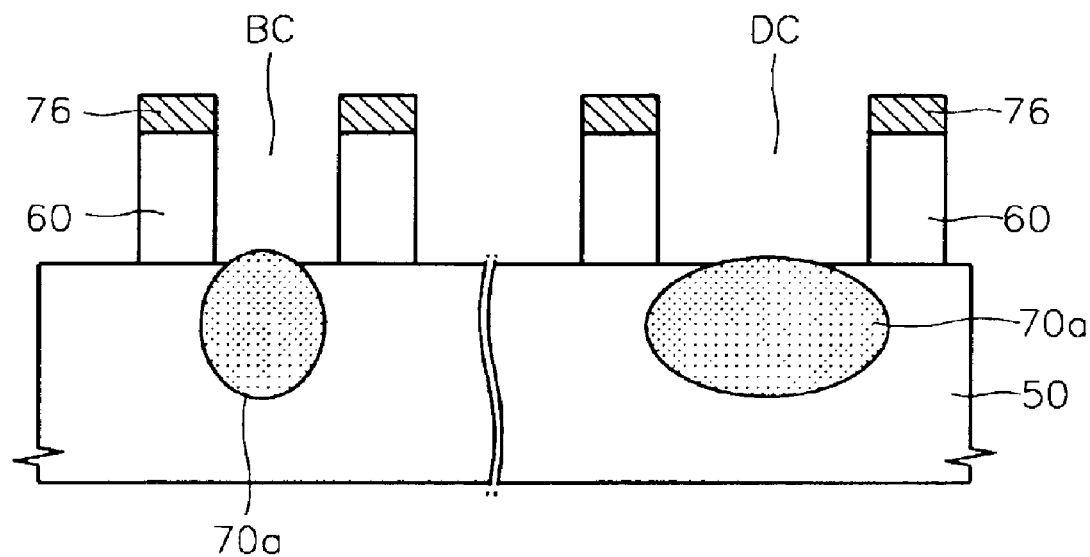
FIG. 6 is a cross-sectional diagram for describing a manufacturing process of plug ion injection regions of FIGS. 4 and 5.

FIG. 6 is a cross-sectional diagram for describing a manufacturing process of plug ion injection regions of FIGS. 4 and 5.

Referring to FIG. 6, gate stack patterns 60 and self-aligned contact patterns 76 are formed on a semiconductor substrate such as a silicon substrate. The semiconductor substrate is divided into a first portion having a BC hole and a second portion having a DC hole. As described in FIG. 3, a region for exposing the BC hole is narrower than a region for exposing the DC hole.

Plug ion injection regions 70A are formed in the semiconductor substrate having the DC hole and the BC hole by implanting impurity with phosphorous by using about $1E+^{13}/cm^2$ of dose amount and about 40 kev to about 60 kev of energy. Depths of the plug ion injection regions 70a are substantially similar in the DC hole and the BC hole.

Figure 7:
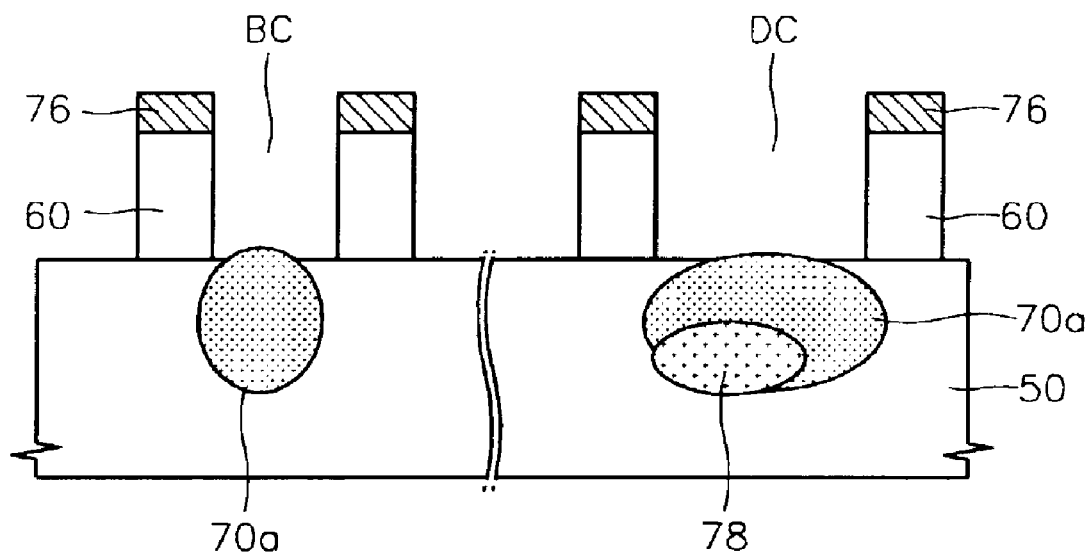
FIGS. 7 and 8 are cross-sectional diagrams for describing a manufacturing process of a compensation ion injection region of FIGS. 4 and 5, respectively.
Figure 8:
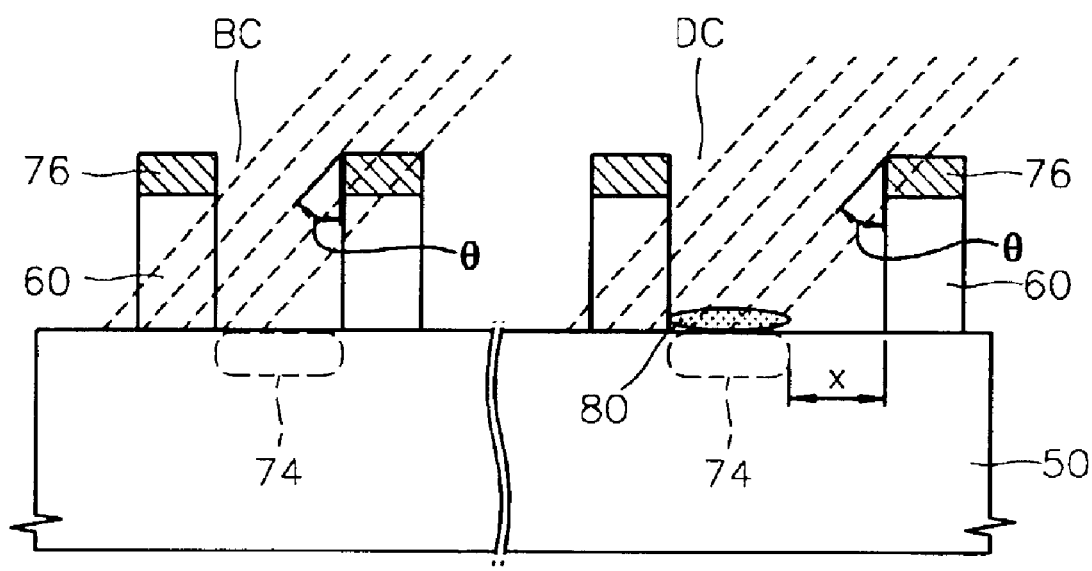

FIGS. 7 and 8 are cross-sectional diagrams for describing a manufacturing process of a compensation ion injection region of FIGS. 4 and 5, respectively.

Referring to FIG. 7, a compensation ion injection region 78 is formed in the plug ion injection region in the DC hole region. The compensation ion injection region 78 is formed by selectively implanting boron with about $6E+^{12}/cm^2$ to about $1E+^{13}/cm^2$ of dose amount and about 20 kev to about 40 kev of energy by using the self-aligned contact patterns 76 and the gate stack patterns 60 as masks. By forming the compensation ion injection region 78 having boron, a depth of the plug ion injection region under the DC hole is shallower than a depth of the plug ion injection region under the BC hole.

According to an embodiment of the present invention, when the impurity is implanted into the plug ion injection region 70A for forming the compensation ion injection region 78, profiles of the source/drain junction regions are varied by varying the spacing between the self-aligned contact patterns 76. Preferably, the impurity for forming the compensation ion injection region 78 is implanted with an inclined angle θ by using the self-aligned contact patterns 76 and the gate stack patterns 60 as masks as shown in FIG. 8. Especially, since the space between the self-aligned contact patterns 76 in the region of the BC hole is smaller than the space between the self-aligned contact patterns 76 in the region of the DC hole and the height of the gate stack patterns 60 and the self-aligned contact patterns is substantially high, the impurity with an injection angle of an inclined angle θ is selectively implanted into the region of the DC hole for forming the compensation ion injection region 78 without using an additional mask to block the BC region. For example, if the height from the semiconductor substrate 50 to the self-aligned contact pattern is 4000 Å, a blocking distance X not having implanted portion in the semiconductor substrate 50 is 4000 Å*tan θ. If the inclined angles θ are 10°, 15°, 20°, and 30°, the blocking distance X is 700 Å, 1100 Å, 1500 Å, and 2300 Å. Thus, in case of a space between the BC holes is about 1600 Å, if the inclined angle θ is about 300, the impurity is only implanted into the semiconductor substrate 50 under the DC hole. Reference numeral 80 denotes an implanted region by implanting the impurity with an injection angle of an inclined angle θ.

Advantageously, the memory cell transistor of the DRAM device includes a plug ion injection region connected to the BC node formed deeper, which improves static refresh characteristics, and the plug ion injection region connected to the DC node formed shallower, which improves dynamic refresh characteristics.

Although the present invention has been described herein with reference to the accompanying drawings, it is to be understood that the present invention is not limited to those precise embodiments, and various other changes and modifications may be affected therein by one skilled in the art without departing from the scope or spirit. All such changes and modifications are intended to be included within the scope of the invention as defined by the appended claims.

What is claimed is:

1. A memory cell transistor of a DRAM device, comprising:
    a gate stack pattern formed on a semiconductor substrate;
    a DC node and a BC node formed substantially under lateral sides of the gate stack pattern in the semiconductor substrate, the DC node and the BC node being electrically connected to a bit line and a storage electrode of a capacitor, respectively;
    a first source/drain junction region formed under the DC node and a second source/drain junction region formed under the BC node,
    wherein the first source/drain junction region has a profile which is different from that of the second source/drain junction region, and wherein the first source/drain junction region and second source/drain junction region are formed with a same first impurity, and wherein the source/drain junction regions comprise source/drain ion injection regions and plug ion injection regions formed under the DC node and the BC node; and
    a compensation ion injection region formed in the plug ion injection region under the DC node, wherein the compensation ion injection region is formed with a second impurity.

2. The memory cell transistor of claim 1, wherein a depth of the second source/drain junction region electrically connected to the BC node is deeper than a depth of the first source/drain junction region electrically connected to the DC node.

3. The memory cell transistor of claim 1, wherein the first impurity is phosphorous.

4. The memory cell transistor of claim 1, further comprising spacers on both lateral sides of the gate stack pattern.

5. The memory cell transistor of claim 1, wherein the second impurity is boron.

6. A memory cell transistor of a DRAM device, comprising:
    a gate stack pattern formed on a semiconductor substrate;
    a DC node and a BC node formed substantially under lateral sides of the gate stack pattern and substantially in a surface of the semiconductor substrate, the DC node and the BC node being electrically connected to a bit line and a storage electrode of a capacitor, respectively;
    source/drain junction regions comprising source/drain ion injection regions and plug ion injection regions formed under the DC node and the BC node, the plug ion injection regions being formed deeper than the source/drain ion injection regions,
    wherein profiles of the source/drain junction regions are different, and wherein the ion injection regions and the plug ion injection regions are formed with a same first impurity; and
    a compensation ion injection region formed in the plug ion injection region under the DC node, wherein the compensation ion injection region is formed using a second impurity.

7. The memory cell transistor of claim 6, wherein a depth of the source/drain junction region electrically connected to the BC node is deeper than a depth of the source/drain junction region electrically connected to the DC node.

8. The memory cell transistor of claim 6, wherein the first impurity is phosphorous.

9. The memory cell transistor of claim 6, further comprising spacers on both lateral sides of the gate stack pattern.

10. The memory cell transistor of claim 6, wherein the plug ion injection region formed under the BC node is formed deeper than the plug ion injection region formed under the DC node.

11. The memory cell transistor of claim 6, wherein the second impurity is boron.

12. The memory cell transistor of claim 6, wherein the first impurity is phosphorous and the second impurity is boron.

13. A memory cell transistor of a DRAM device, comprising:
    a gate stack pattern formed on a semiconductor substrate;
    a DC node and a BC node formed substantially under lateral sides of the gate stack pattern in the semiconductor substrate, the DC node and the BC node being electrically connected to a bit line and a storage electrode of a capacitor, respectively;
    a first source/drain junction region formed under the DC node and a second source/drain junction region formed under the BC node, wherein the source/drain junction regions comprise source/drain ion injection regions and plug ion injection regions, wherein the first and second source/drain junction regions are formed of a first impurity; and
    a compensation ion injection region formed in the plug ion injection region under the DC node, wherein the compensation ion injection region is formed of a second impurity.

14. The memory cell transistor of claim 13, wherein the first impurity is phosphorus and the second impurity is boron.

15. The memory cell transistor of claim 13, wherein the plug ion injection region formed under the BC node is formed deeper than the plug ion injection region formed under the DC node.

16. The memory cell transistor of claim 13, wherein a depth of the second source/drain junction region is deeper than a depth of the first source/drain junction region.

* * * * *